United States Patent [19]

Frankeny et al.

[11] Patent Number: 5,363,275
[45] Date of Patent: Nov. 8, 1994

[54] MODULAR COMPONENT COMPUTER SYSTEM

[75] Inventors: Jerome A. Frankeny, Taylor; Richard F. Frankeny, Austin, both of Tex.; Karl Hermann, Romulus, N.Y.; Ronald L. Imken, Round Rock, Tex.

[73] Assignee: International Business Machines Corporation, Armonk, N.Y.

[21] Appl. No.: 15,989

[22] Filed: Feb. 10, 1993

[51] Int. Cl.$^5$ .............................. H05K 1/00
[52] U.S. Cl. ........................ 361/749; 174/254
[58] Field of Search ............... 29/829, 830, 832; 156/297, 298, 299; 174/254, 255, 260, 268, 70 B; 361/749, 753, 792–795; 439/47, 67, 77, 108; 428/901

[56] References Cited

U.S. PATENT DOCUMENTS

| | | | |
|---|---|---|---|
| 3,221,095 | 11/1965 | Cook | 361/749 |
| 3,409,732 | 11/1968 | Dahlgren et al. | 361/749 |
| 3,546,775 | 12/1970 | Lalmond et al. | |
| 4,296,457 | 10/1981 | Hahlganss | 361/749 |
| 4,495,546 | 1/1985 | Nakamura et al. | |
| 4,587,596 | 5/1986 | Bunnell | |
| 4,628,408 | 12/1986 | Kimura | 361/749 |
| 4,677,527 | 6/1987 | Pasterchick, Jr. et al. | |
| 4,754,316 | 6/1988 | Reid | |
| 4,868,712 | 9/1989 | Woodman | |
| 4,902,236 | 2/1990 | Hasircoglu | |
| 4,939,514 | 7/1990 | Miyazaki | |
| 4,976,626 | 12/1990 | Dibble et al. | |
| 4,997,377 | 5/1991 | Goto et al. | |
| 5,001,604 | 3/1991 | Lusloy | 361/749 |
| 5,008,496 | 4/1991 | Schmidt et al. | |
| 5,050,039 | 9/1991 | Edfors | |
| 5,057,676 | 10/1991 | Komaki | |
| 5,058,053 | 10/1991 | Gillett | |
| 5,093,761 | 3/1992 | Ozaki | 361/749 |
| 5,266,746 | 11/1993 | Nishihara et al. | 174/254 |

FOREIGN PATENT DOCUMENTS 0013335  7/1980  European Pat. Off. ............ 361/749

OTHER PUBLICATIONS

IBM TDB, "High Density Flexible Connector", vol. 32, No. 7, Dec. 1989, pp. 344–345.

Primary Examiner—Leo P. Picard
Assistant Examiner—Donald A. Sparks
Attorney, Agent, or Firm—Mark E. McBurney

[57] ABSTRACT

Discrete computational elements are provided that will be connected to a base unit, and to one another or I/O devices, in order to configure a particular computer system. The base unit provides the electrical power required to energize the computational elements. A plurality of identically configured substrates are joined in a layered relation and are electrically connected with one another. These substrates are capable of being fabricated of different lengths such that they can extend outwardly from the computational element and may be connected to other computational elements. At least one integrated circuit will be placed on one side of the joined substrates and is electrically connected to each substrate layer. In this manner the ICs will be able to communicate with chips on other computational elements. A support member is also included that stiffens the plural substrate layers and independently distributes electrical power through voltage and ground potential planes, and interconnected substrate layers, to the chips. The support member will be disposed adjacent the substrate layers on a side opposite the ICs and independently attachable to the base unit by using electrical connection pins, a pluggable lip portion, or the like.

21 Claims, 11 Drawing Sheets

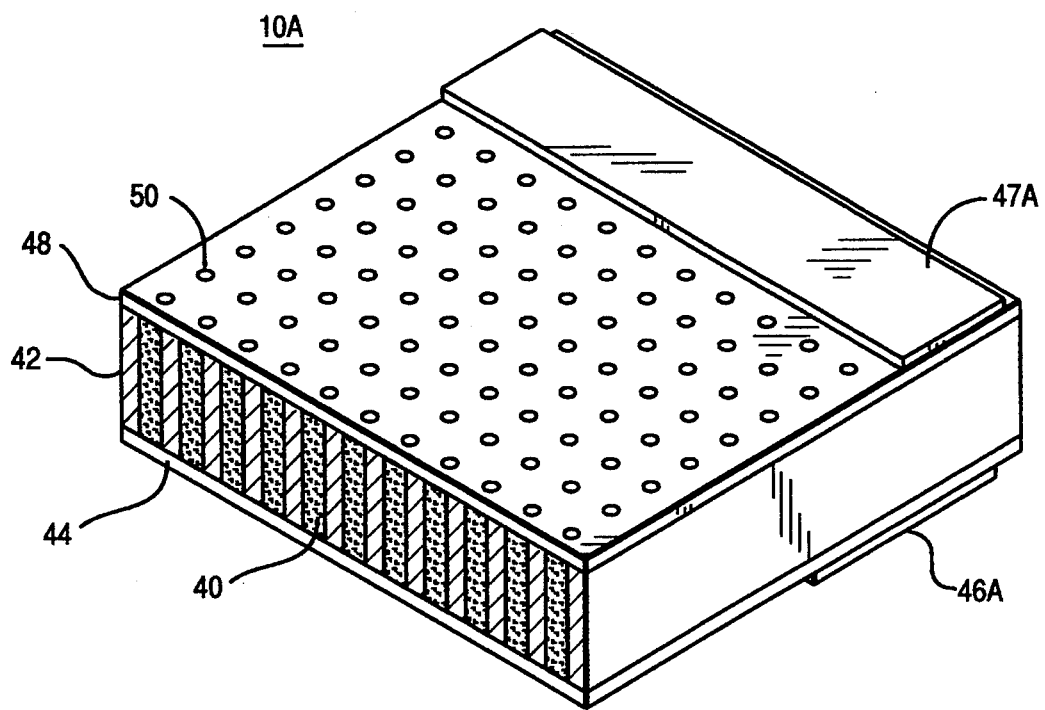
FIG. 7
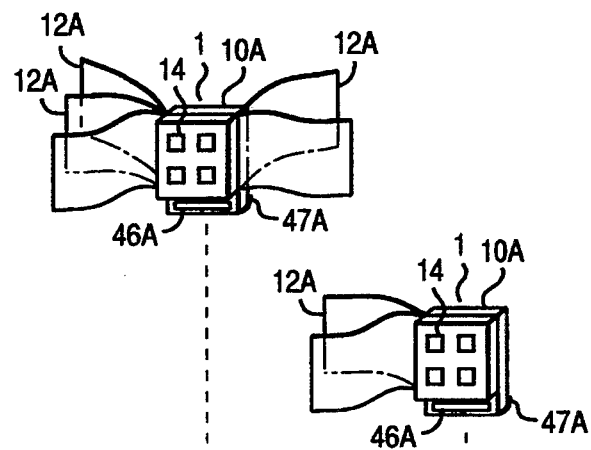
FIG. 8
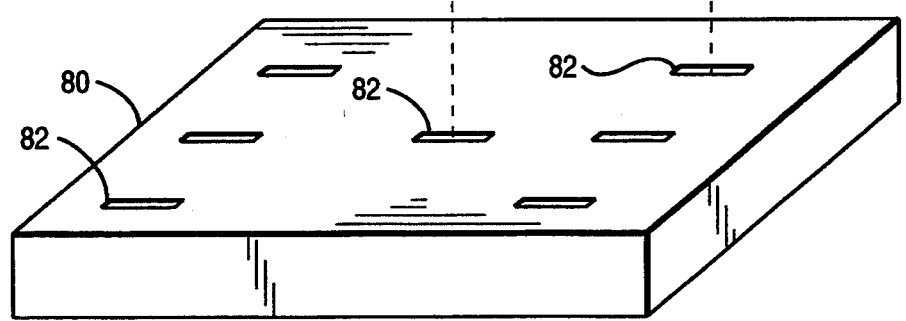

MODULAR COMPONENT COMPUTER SYSTEM

BACKGROUND OF THE INVENTION

1. Field of the Invention

The present invention relates generally to the packaging of computer components. More specifically, a pluggable modular component is used to replace a conventional planar and attached function cards. The modular component includes several identically configured, interconnected substrate layers and has a plurality of electronic components thereon. The modular component is mounted on a base portion and each substrate layer is externally interconnectable with other similar modular components.

2. Description of Related Art

Multichip modules (MCM) are well known in the art and are typically configured with a plurality of integrated circuit devices (IC) on interposer-type substrate layers. Input/outpost interconnection means are then provided to electrically connect the ICs to a computer planar.

U.S. Pat. No. 5,050,039 shows multiple chips disposed on an interconnect board, which is in turn connected to the top surface of a high density signal carrier board by a flex connector. U.S. Pat. No. 4,754,316 illustrates interconnection of semiconductor circuits using an elevated portion of one substrate contacting bonding pads of an adjacent substrate. U.S. Pat. No. 5,058,053 shows a computer system having a plurality of processor modules and memory modules disposed in a stacked relation. Switch modules are also stacked and couple the memory modules with the processor modules through a ribbon cable. U.S. Pat. No. 4,997,377 illustrates interconnecting a computer card with chips thereon to a computer planar through a chip carrier and flexible circuit strip. U.S. Pat. No. 3,546,775 shows a multi-layer circuit having layers extending outwardly in different directions.

None of the previously described conventional systems allow for the direct interconnection of discrete computational elements with one another or other I/O devices within a computer system. Therefore it can be seen that a system which will allow a substantially unlimited number of directly interconnected computer packages would be highly desirable. Further, a system that will allow for the elimination of a computer planar, or "motherboard" and use similar technology processes in fabricating this system would also be advantageous.

SUMMARY OF THE INVENTION

In contrast to the prior art, the present invention allows for discrete computational elements to be connected to a base unit, anti to one another or I/O devices, as required for the particular system being configured. The base unit provides the electrical power required to energize the computational elements. A plurality of identically configured substrates are disposed and joined in a layered relation and are electrically connected with one another. These substrates are capable of being fabricated of varying lengths such that they may extend outwardly from the computational element and may be connected to other computational elements. It should be noted that all of the substrate layers are formed using an identical process, regardless of whether they are contained within the computational element or extend outward from the computational element, to be joined with substrates from other computational elements.

At least one IC will be placed on one side of the joined substrates and is electrically connected to each substrate layer in the computational element. In this manner the ICs will be able to communicate with chips on other computational elements through the extended substrate layers which are electrically connected to each other. Of course, plural integrated circuit devices can be placed on one side of the element. Further, ICs can be placed on more than one side of the computational element when substrate layers are placed on both sides of the support means, described below.

The computational element of the present invention also includes support means that stiffens the plural substrate layers and distributes electrical power from the computer system base to the chips, through the interconnected substrate layers. The support means will be disposed adjacent the substrate layers on a side thereof opposite the ICs. Interconnection with the base unit can be achieved by pins, solder balls, or the like that are disposed along a flat surface of the computational element, or by extending the support means away from the computational element in order to form a lip portion with an edge connection, or the like that can be plugged into the base unit. As discussed in more detail below, different materials, and different configurations of these materials are used to construct the support means of the present invention in order to enhance the power distribution characteristics. Also, the power and signal inputs to the computational element are separated such that enhanced electrical characteristics can be achieved by the present invention.

It will be understood that the computational elements of the present invention can be configured in virtually unlimited combinations in order to form various computer systems ranging from a palmtop, or laptop to an advanced workstation or mainframe.

Therefore, in accordance with the previous summary, objects, features and advantages of the present invention will become apparent to one skilled in the art from the subsequent description and the appended claims taken in conjunction with the accompanying drawings.

BRIEF DESCRIPTION OF THE DRAWINGS

FIG. 7 is another perspective view of the power plane support means with a bus connection for the conductive strips wherein voltage and ground buses are disposed on opposite sides;

FIG. 8 is an exploded view of computational elements of the present invent, ion being plugged into the base unit, and having interconnectable extended substrate layers;

DETAILED DESCRIPTION OF THE PREFERRED EMBODIMENTS

Figure 1:
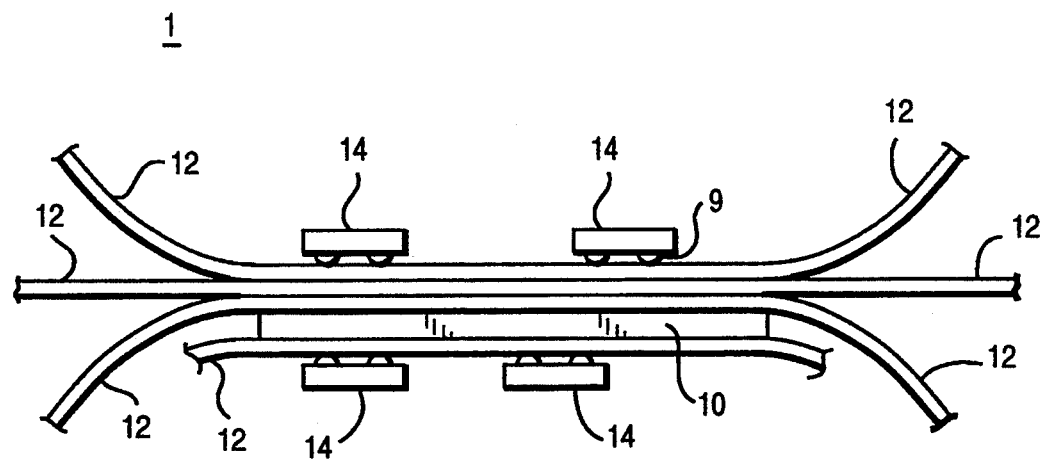
FIG. 1 is a side view of a computational element of the present invention showing substrate layers that are in the computational element and extend away from the element and the ICs and support means disposed thereon.

Referring to FIG. 1, a computational element generally referred to by numeral 1 is shown. A power distribution and support means 10 is shown having a plurality of substrate layers 12 adjoining one side of the power plane 10. Integrated circuit devices 14 are then placed on a side of tile joined substrate layers 12 opposite the power plane 10 to form computational element 1. It will be seen from tile subsequent drawings and description that chips 14 are electrically connected to power plane 10 and to other chips 14 through inputs/outputs connection points 9 such as controlled collapsed chip connect (C4) solder balls. Additionally, vias are formed through the adjacent substrate 12 to interconnect chips 14 to the desired individual substrate layers 12 and power plane 10. It can be seen that the portion of substrates 12 which are adjacent power plane 10 will be substantially rigid whereas the portion of the substrate 12 extending outwardly away from power plane 10 will be substantially flexible. Furthermore, it is apparent from FIGS. 1, 9 and 10 that substrate layers 12, and corresponding chips 14, can be affixed to both sides of power plane 10.

Figure 2:
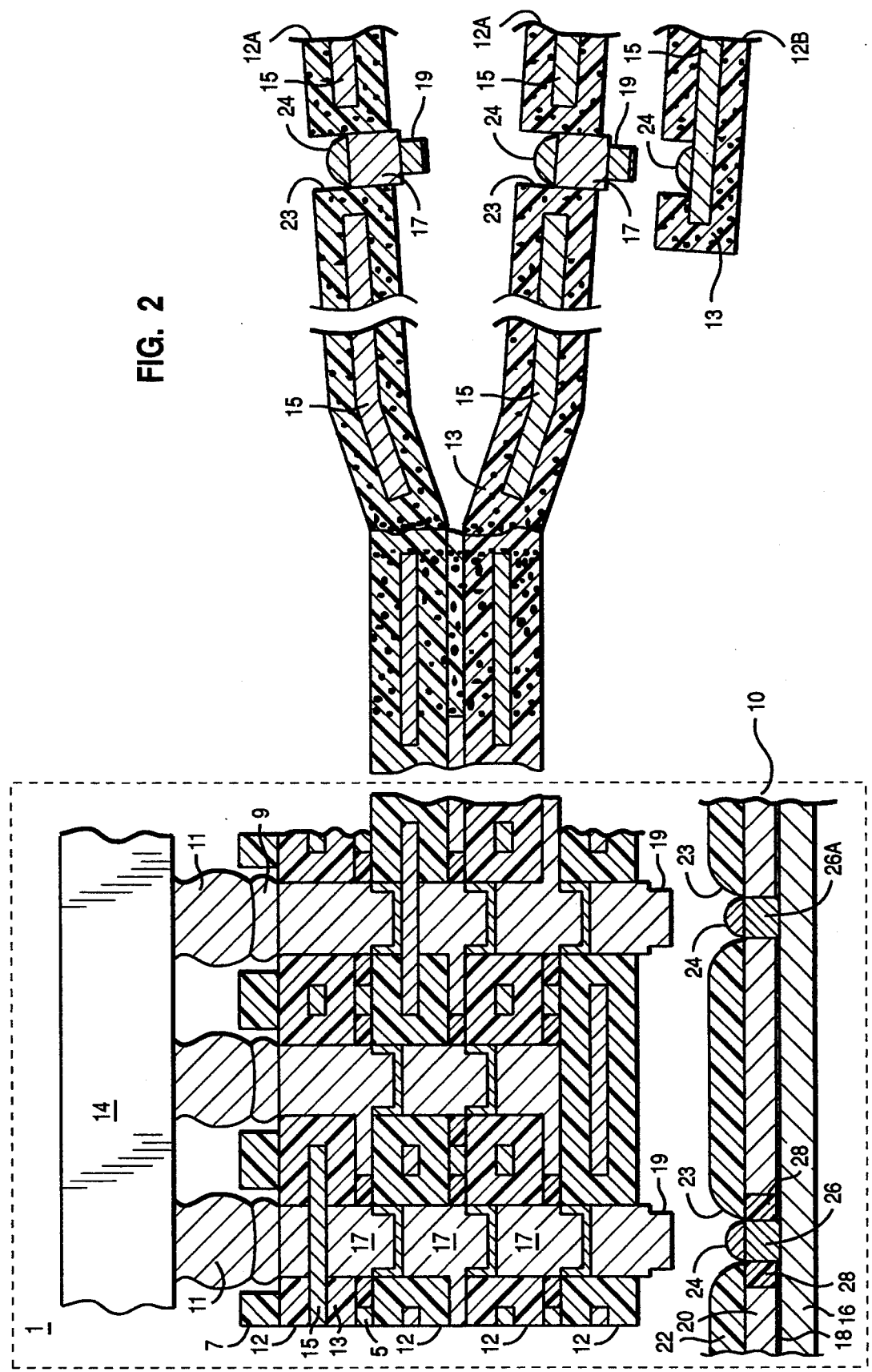
FIG. 2 is another side view of one preferred embodiment of the computational element of the present invention and the electrical interconnection between the substrate layers, chips, and support means, as well as the interconnection with other computational elements.

FIG. 2 shows the overall configuration and interconnection scheme of computational element 1 in accordance with the invention. Computational element 1 is again generally referred to by reference numeral 1 and enclosed in the dashed line shown on FIG. 2. Again, plural substrate layers 12 are shown in adjoining relation to one another. Substrate layers 12 are one signal one plane (1S1P) substrates that include a voltage plane 15, which distributes electrical power, and is made of a conductive material such as copper, or copper-invar-copper (CIC) along with dielectric material 13 (such as polyimide) surrounding the voltage plane 15. Circuitized lines 5 are formed on one side of the substrate 12 and disposed intermediate adjacent substrate layers when they are registered with one another and laminated. Vias 17 are shown which are formed in the individual substrate layers and are used to make electrical connections with the plane 15, or with an adjoining substrate layer 12. It should be noted that the substrate 12 and method for making substrate 12 is described in U.S. Pat. Nos. 5,146,674 and 5,121,299, hereby incorporated by reference. Projections 19 extend from each substrate layer 12 and are used to connect substrate layer 12 with one another and other compatible electronic structures such as power plane 10 by insertion into cavities 23. Power plane 10 is shown which includes a ground plane 16 and voltage plane 20 that distributes electric power to the computational element. Planes 16 and 20 will be of a suitable electrically conductive material such as copper, CIC, or the like. A dielectric layer 18 is disposed intermediate planes 16 and 20 to electrically isolate them from one another. It wi 11 be understood that planes 16 and 20 may be at a certain voltage or at ground potential. For description purposes only, plane 16 will be designated as the voltage plane and plane 20 as the ground plane. It can be seen that via 26 will provide electrical connection to voltage plane 16 with joining metallurgy 24, such as solder, or the like disposed in cavity 23. More specifically, voltage plane 16 is electrically connected through via 26 to joining metallurgy 24 (within cavity 23), projection 19 (inserted into cavity 23) and vias 17 within computational element 1, to chip 14 by solder balls 11 and respective joining metallurgy 9. It can be seen that additional dielectric material 28 is disposed around via 26 to provide electrical installation from ground plane 20. Similarly, it can be seen how ground plane 20 is electrically connected with chip 14 through via 26a, joining metallurgy 23 (within cavity 24), projection 19, vias 17, joining metallurgy 9 and C4 solder balls 11. In this manner voltage and reference potential is supplied to the chip 14 by power plane 10. Of course, plane 16 (which supplies electrical power) is electrically connected to an electrical source and is described in greater detail below. It can be seen from FIG. 2 that substrates 12 are extendable away from computational element 1. Two such substrates are shown extending rightwardly from computational element 1 of FIG. 2 and then separating to form flexible substrates 12a each having characteristics identical to the substrates 12 which are rigidly disposed adjacent one another in computational element 1. In particular, it can be seen that each substrate 12 includes a ground plane 15, surrounded by dielectric material 13 and having vias 17 with projections 19 and cavitites 23 with joining metallurgical material 24 therein. Additionally, it can be seen how an additional substrate 12b which may be associated with another computational element 1 (not shown) can be interconnected to any of the extended substrates 12a in a manner as previously described in copending U.S. patent application Ser. No. 07/808,261, filed Dec. 13, 1991, hereby incorporated by reference. The substrates 12 of computational element 1 are joined to one another with one of several techniques such as applying bonding material (e.g. epoxy) using curtain coating, spray coating, off set printing techniques or the like as described in co-pending U.S. patent application, Ser. No.

07/724,246, filed Jul. 1, 1991, hereby incorporated by reference. Therefore, it can be seen how flexible substrates 12a extending from a single computational element can be interconnected to other flexible substrates 12b associated with additional computational elements 1. In this manner, a virtually unlimited number of computational elements, each having associated integrated circuit devices 14 thereon can be interconnected and operate in conjunction with one another.

Figure 3:
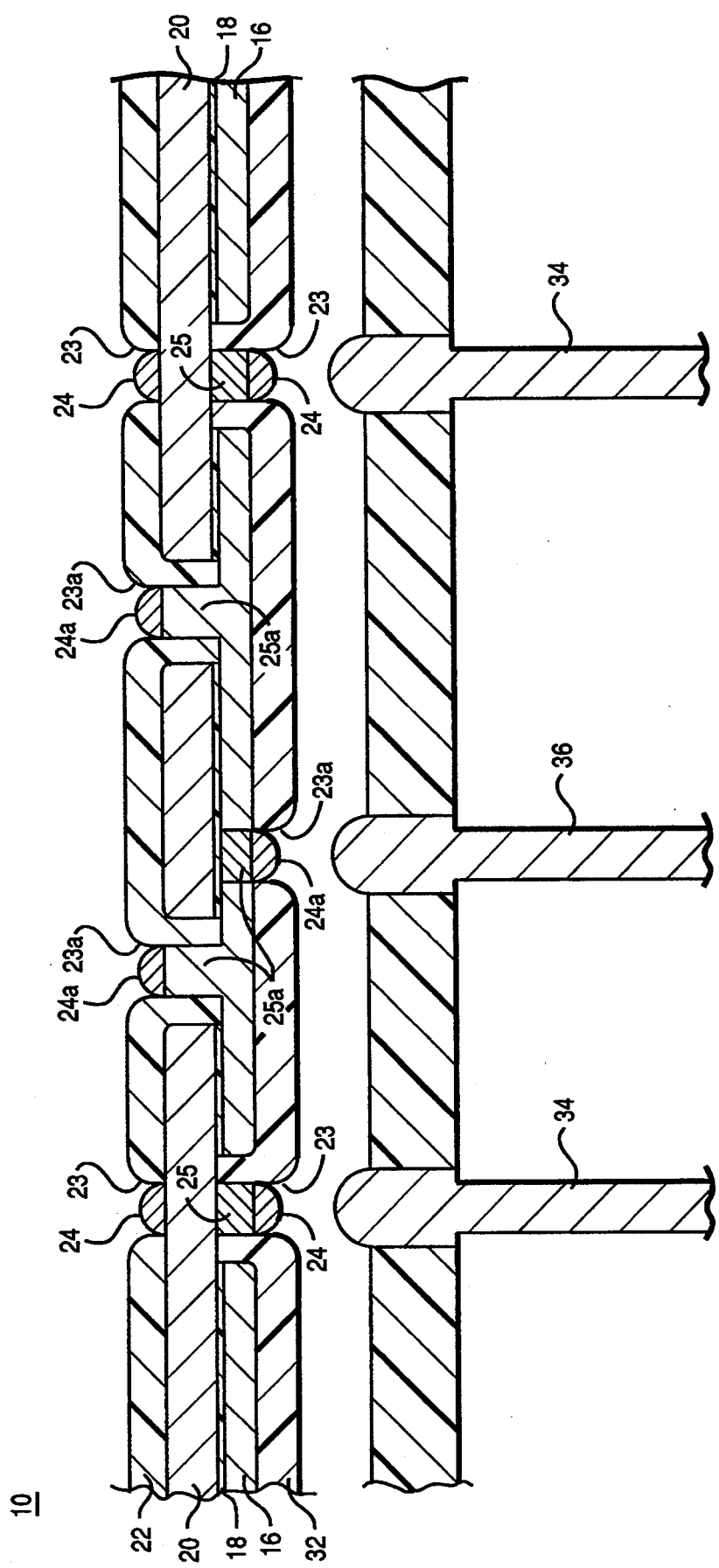
FIG. 3 shows one preferred embodiment of the electrical connection between the support means and the pins used to make the power connection with the computer base unit.

Referring to FIG. 3, a more detailed view of one embodiment of power plane and support means 10 is shown. In particular, power distribution element 30 is shown having posts, or pins 34 and 36 formed therein. Element 30 is fabricated from a rigid non-electrically conductive material, such as a polyimide material of a sufficient thickness. Posts 34 and 36 are made up of an electrically conductive material and disposed within element 30. It can be seen that the ends of posts 34 and 36 are capable of being plugged into a connector (not shown) that can supply electrical voltage and power, and ground potential thereto. In particular, it will be understood how posts 34 and 36 can provide either voltage or ground potential, respectively to the computational element 1 of the present invention, depending on the electrical connector within the computer base. Voltage and ground planes 16 and 20 are shown in a manner similar to that of FIG. 2, with intermediate material having a high dielectric constant 18 disposed therebetween. Dielectric material 22 is formed on a top surface of ground plane 20 to provide electrical insulation for plane 20, except at cavities 23 which have joining metallurgical material 24 therein. Additionally, it can be seen that cavities 23 are formed in another dielectric layer 32 disposed adjacent voltage plane 16 on a side opposite of plane 20. Similarly, joining metallurgical material 24 is also disposed within cavities 23 formed within dielectric material 32. Conductive posts 25 and 25a are also used in the structure of FIG. 3 to electrically connect the joining metallurgy 24 within cavities 23 to appropriate planes 16 and 20. For example, it can be seen that when power element 30 and power distribution plane and support means 10 are pressed adjacent one another, posts 34 are in electrical communication with plane 20 through joining metallurgy 24 within cavities 23 and conductive vias 25 which are adjacent to and in electrical contact with plane 20. It can be seen that the vias 25 adjacent posts 34 are electrically insulated from plane 16 by dielectric material 32. In contrast, post 36 is in electrical communication with plane 16 through metallurgy 24a within cavity 23a and via 25a which directly contacts plane 16. Additionally, metallurgy 24a within cavities 23a (formed in dielectric material 22) are also in communication with plane 16 through via 25a such that cavities 23a are in electrical contact with plane 16. Again, it can be seen that planes 16 and 20 can be either one of a respective voltage or ground plane with posts 34 and 36 having the appropriate electrical potential. In this manner, projections 19 of computational element 1 (FIG. 2) are appropriately interconnected with the chip I/Os 11 to provide either voltage or ground potential to integrated circuit device 14. It should be noted that power distribution element 10 can be fabricated in a manner identically to substrate layers 12 using the process of previously identified U.S. Pat. No. 5,146,674.

Figure 4:
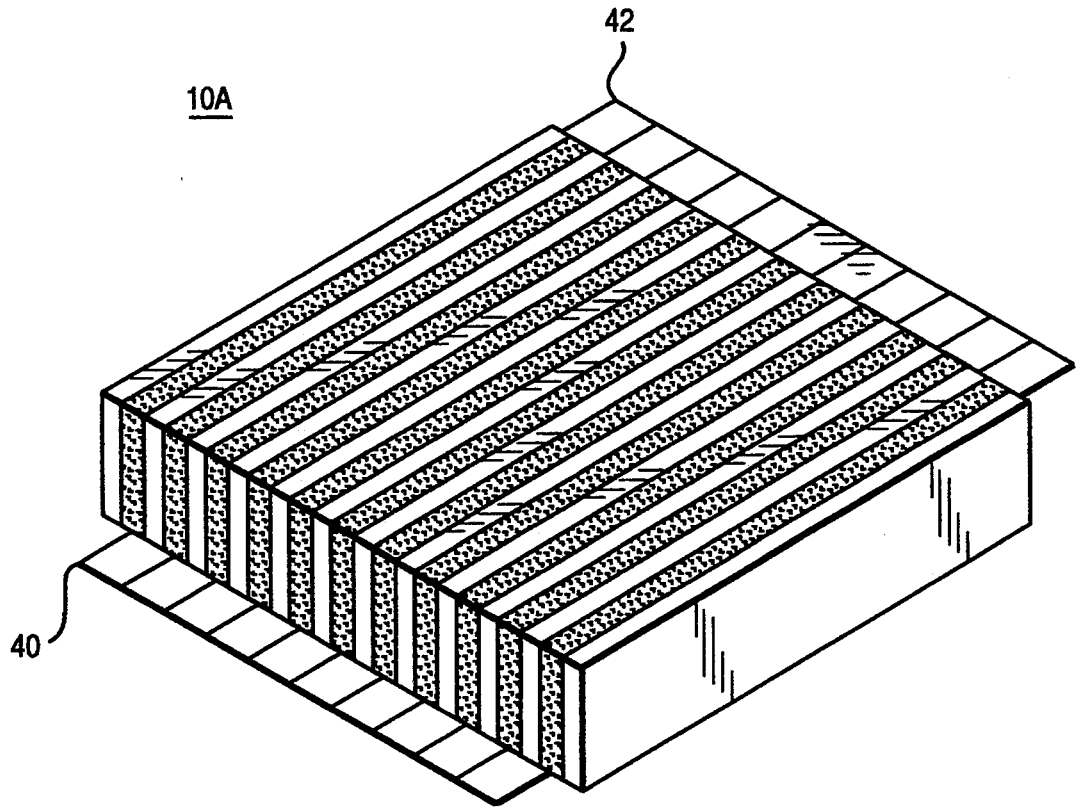
FIG. 4 is a perspective view of a preferred embodiment of the support means wherein dielectric layers are alternately disposed between voltage and ground conductor layers.

In a computer system it is often desirable to have a power distribution source that is a passive element capable of distributing low frequency power. This will provide for low DC losses as well as high frequency storage. Thus, low DC losses will be present when power is being distributed to the computational elements and the high capacitance will provide low inductance to handle high frequency transients present when signals are transmitted between computational elements. FIG. 4 shows one embodiment of a power distribution element 10a that meets the aforementioned criteria. As can be seen, strips of electrically conductive material, such as copper or CIC 42 are present with a high dielectric material such as barium titanate 40 disposed intermediately therebetween. Thus, high capacitance is present between the adjoining conductive layers 42. At the same time, the conductive strips 42 are of a sufficient thickness to provide low resistance and low inductance in order to minimize DC power losses. Of course, other high dielectric materials 40 can be placed intermediate conducting layers 42, but barium titanate has been show to give good results.

Figure 5:
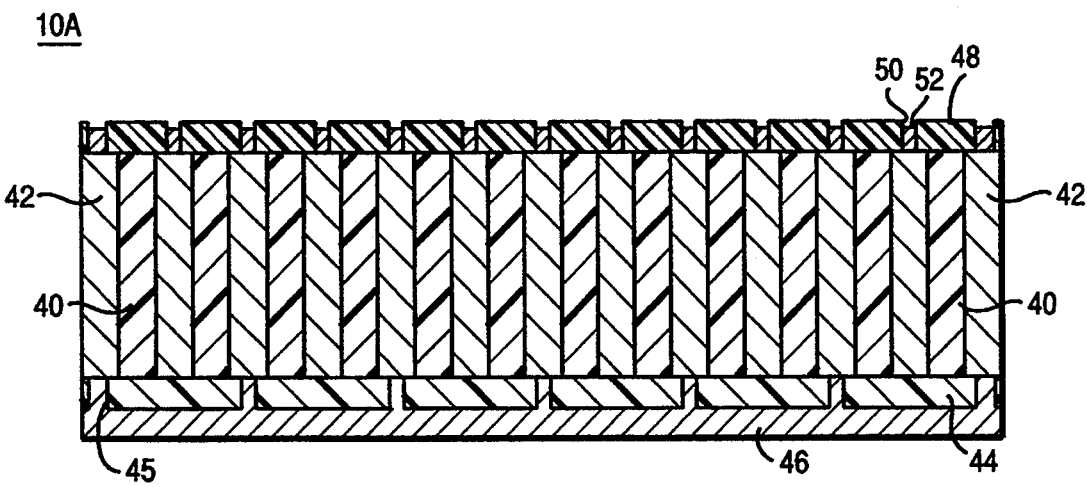
FIG. 5 is a crossection of the support means of FIG. 4 that also shows means for connecting the conductor layers as a bus and for interconnecting with the substrate layers of a computational element.

FIG. 5 is a cross sectional view of the power plane 10a shown in FIG. 4 including all the bus interconnections and the interface required to connect element 10a with substrate layer 12. It can be seen that alternating strips 40 and 42 of dielectric material and conductive material, respectively, are shown. Additionally, a bus 46 is shown that will connect alternating ones of conductive strips 42 into a voltage or ground bus. Another similar bus 47 (FIG. 6) will be used to connect the remaining strips 42 into the remaining voltage or ground bus. Those skilled in the art will understand that buses 46 and 47 can be formed by applying a layer of dielectric material 44 to a planar surface (perpendicular to conductive strips 40, 42) of power distribution element 10a, and then forming interconnection cavities 45 therein by photoimaging the dielectric material 44 through a mask. Conductive material that will be used in bus 46 is then plated, or the like, into cavities 45 and along the outer surface of dielectric material 44, thereby creating bus 46.

Additionally, the same process used to form substrate 12 of FIG. 2 can be used to provide the interface between power plane 10a and substrate 12. A dielectric layer 48 is placed on a side of power distribution element 10a opposite bus 46. Cavities 50 are then formed therein that correspond to conductive strips 42. Metallurgical material 52 is then placed within cavities 50 such that interconnection between projections 19 of substrate 12 (FIG. 2) and conductive strips 42 can be made. In this manner, depending on the configuration, either voltage or ground potential can be communicated from strips 42 through metallurgy 52 and projections 19 into computational element 1 and ultimately to chip 14 disposed thereon.

Those skilled in the art will also appreciate the cooling effect of power distribution element 10a. Conductive strips 42 provide excellent thermal transfer characteristics. Heat generated by chips 14 is transferred through solder balls 11, vias 17, projections 17 onto conductive layers 42 and then dissipated. Of course, the greater the exposed area of conductive layers 42, the more heat that can be dissipated. Therefore, a configuration wherein substrates 12 are placed on only one side of power distribution element 10a (leaving the other side exposed) will provide improved heat transfer characteristics when compared to placing substrates 12 on both sides of element 10a. Further, use of a fan, or the like, to move coolant, e.g. air, past power distribution element 10a will provide additional cooling improvements. It can be seen that a fan, or other cooling means can be placed in the base portion 80, or a cover (not shown) in order to provide this improved cooling for the present invention.

Figure 6:
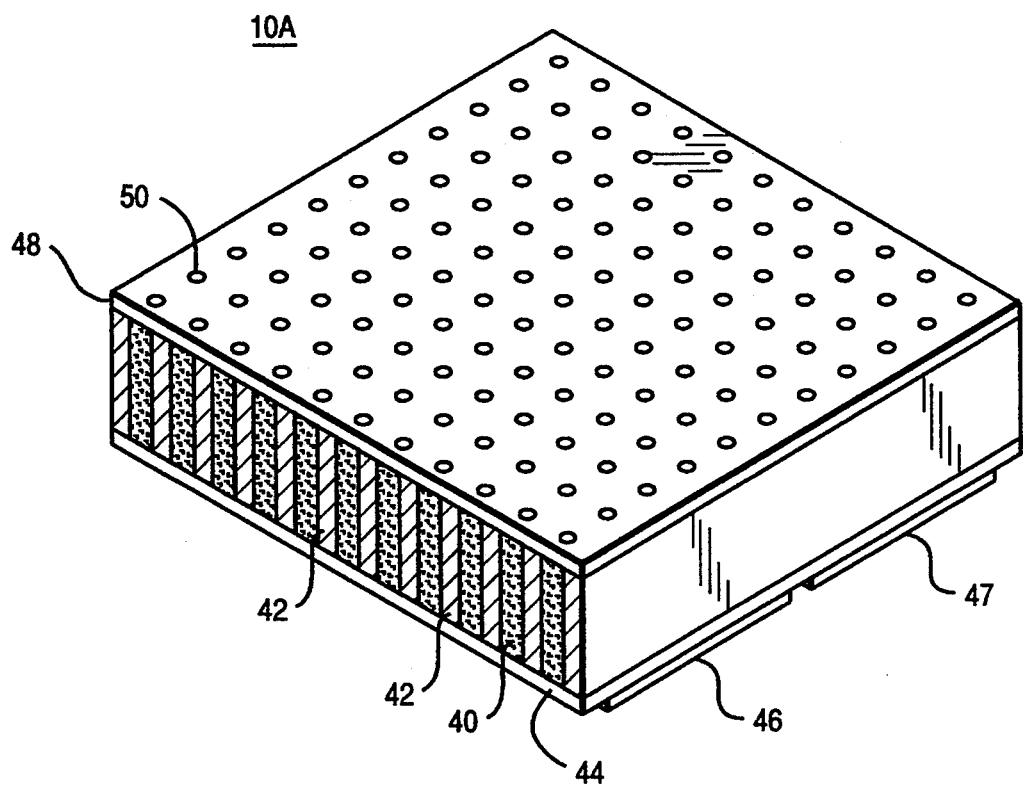
FIG. 6 is a perspective view of the support means with a different bus connection for the conductor layers.

FIG. 6 shows the perspective view of power plane 10a wherein cavities 50 are shown in dielectric layer 48 on a first surface of distribution element 10a. Alternating conductive layer strips 42 and dielectric strips 40 are shown in element 10a along with dielectric material 44 disposed on the surface opposite layer Voltage and ground buses 46, 47 are shown wherein each interconnect to alternating ones of conducting strips 42 in a manner as shown in the cross sectional view of FIG. 5.

FIG. 7 is another embodiment of power plane 10a of the present invention wherein bus 46a is formed on one surface of element 10a and a bus 47a is formed on element 10a on a surface opposite bus 46a. It should be noted that buses 46a and 47a are formed in a manner identically to that previously described with respect to FIG. 5 wherein each are interconnected with alternating ones of metal strips 42 contained in power distribution plane 10a. Again, an interconnection interface is shown disposed on a side of element 10a with a plurality of cavities 50 therein capable of being joined with projections 19 of substrate 12. Additionally, with the configuration as shown in FIG. 7, cavities 50 can be formed in dielectric 44 in order to provide interconnection with another substrate 12 such that substrate 12 can extend from both sides of power plane 10a. Additionally, projections 19 could be formed in dielectric layer 44 such that a plurality of distribution elements 10a as shown in the embodiment of FIG. 7 can be stacked in order to increase the capacitive characteristics of the power distribution element and support means 10a. Finally, by having buses 46a and 47a on opposite sides of power distribution element 10a, the power plane 10a can be disposed vertically in a connection means such as an insertion connector, such as is commercially available from Amp, Inc., or the like. In this manner the vertically disposed power distribution elements 10a will provide a smaller footprint within a computer system than a horizontally placed power distribution element. Therefore, multiple computational elements 1, when vertically placed, will provide the same computer processing capacity at a greatly reduced area.

Figure 12:
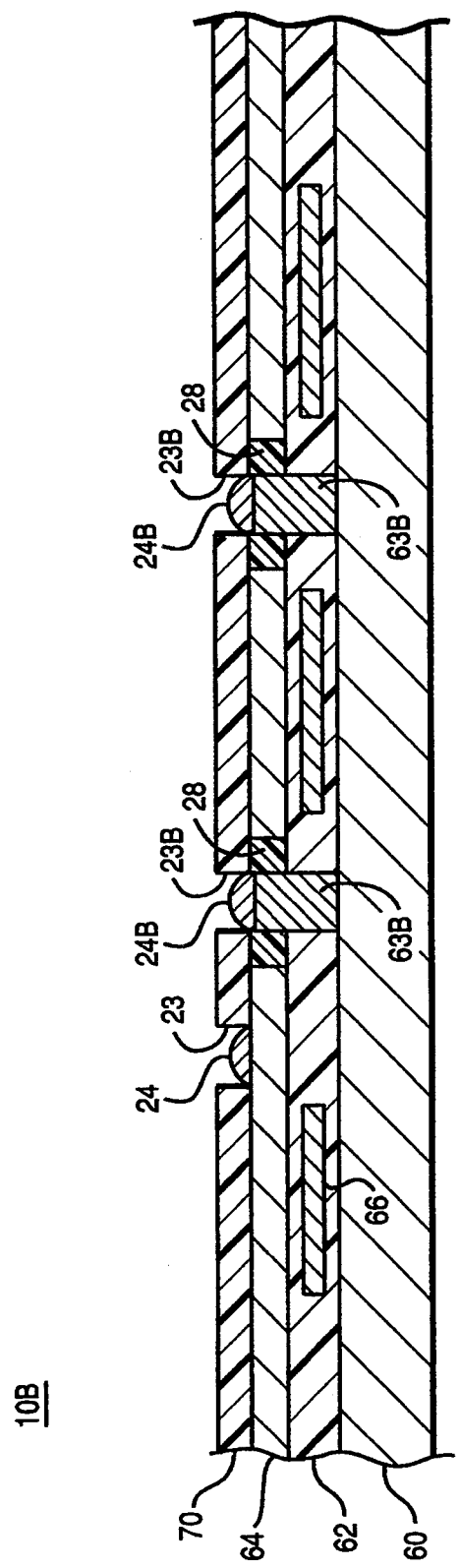
FIG. 12 is another embodiment of the support means wherein barium titanate chips are disposed intermediate the power and ground planes to provide enhanced capacitance characteristics.

Referring to FIG. 12, another embodiment of power plane 10 is shown and genera fly noted by reference numeral 10b. Planes 60 and 64 will constitute the voltage and ground planes, and are made of an electrically conductive material such as copper or CIC. Intermediate voltage and ground planes 60 and 64 is a dielectric material 62 which electrically insulates planes 60 and 64 from one another. Additionally, high dielectric chips 66 are imbedded within dielectric material 62 to increase the capacitance between voltage and ground planes 60 and 64. Again, it is noted that material such as barium titanate (which is also used in the power plane embodiment of FIG. 7) can be used as chips 66 in the embodiment of FIG. 12. Additionally, a dielectric layer 70 is formed on a side of plane 64 opposite barium titanate chip 66 and includes cavities 23 and 23b therein having joining metallurgy 24 and 24b, respectively. Further, it can be seen that cavities 23b are in electrical communication with plane 60 through vias 63b. Insulating material 28b is formed around the periphery of vias 63b in order to electrically insulate them from plane 64. Thus, it can be seen how plane 64 is in electrical communication with metallurgy 24 within cavity 23, and plane 60 is electrically connected to joining metallurgy 24b within cavities 23b through vias 63b. In this manner, projections 19 of substrates 12 can be placed within cavities 23 and 23b such that voltage and reference potential can be supplied to chip 14 (FIG. 2) from planes 60 and 64 when projections 19 are inserted into cavities 23 and 23b of the power plane embodiment of FIG. 12.

Referring to FIG. 8 it can be seen that the computational elements 1, of the present invention, can be used to configure a computer system. A base portion 80 is provided that can be used to provide support for the computational elements 1 and includes slots 82 into which computational elements 1 are inserted and interconnected with a connector within base 80 (not shown) to supply electrical power and ground potential. In this manner, a computational element 1 can be inserted into a slot 82 such that voltage and ground buses 46a and 47a (FIG. 7) are connected to the power supply connector within base 80 in order to independently provide electrical energy to chips 14 through power distribution element and support means 10a and substrate layers 12 (as previously described). Therefore, it can be seen that a plurality of similarly configured computational elements 1 can be inserted into slots 82 such that respective substrate extension layers 12a can be interconnected to one another. Each of the computational elements 1 will be independently connected to an electrical power source, such as a power supply (not shown) disposed within base 80. In this manner the electrical signals transmitted in layers 12 will be separated from the electrical power distributed by support means 10a. This separation of signal and power will greatly enhance the electrical characteristics of the computational element, when compared to conventional cards and multichip modules. As previously noted, connection means such as described in co-pending U.S. patent application, Ser. No. 07/808,261, filed Dec. 13, 1991, can be used to interconnect substrate layers 12a from plural computational elements 1. The computational elements 1 will be used as functional islands in the computer system. That is, one such computational element may be a processor with its corresponding chip set, while others may include such functions as I/O control, graphics, memory, or the like. It can be seen how the computer system as contemplated by the present invention will not require a conventional planar or motherboard, but can use base 80 to receive a virtually unlimited number of computational elements 1 in order to configure a computer system as desired.

One major advantage of the present invention is the separation of the power input to the computational element from the signal lines. With the extremely small spacings used in current packaging technologies, inductance and noise from the power input can cause detrimental electrical characteristics in the signal lines. Thus, having the power and signal I/Os independent of one another is a distinct advantage of the present invention. FIG. 7 shows that buses 46a and 47a, which are used for supplying power to the computational element, are completely independent from the cavities 50 that form the signal I/O points when projections 19 (FIG. 2) are inserted therein. Further, FIG. 8 illustrates the independence of the power and signal functions since the power buses 46a and 47a are inserted into base 82, while signal lines (on substrates 12a) are connected independently to other computational elements or devices.

Figure 9:
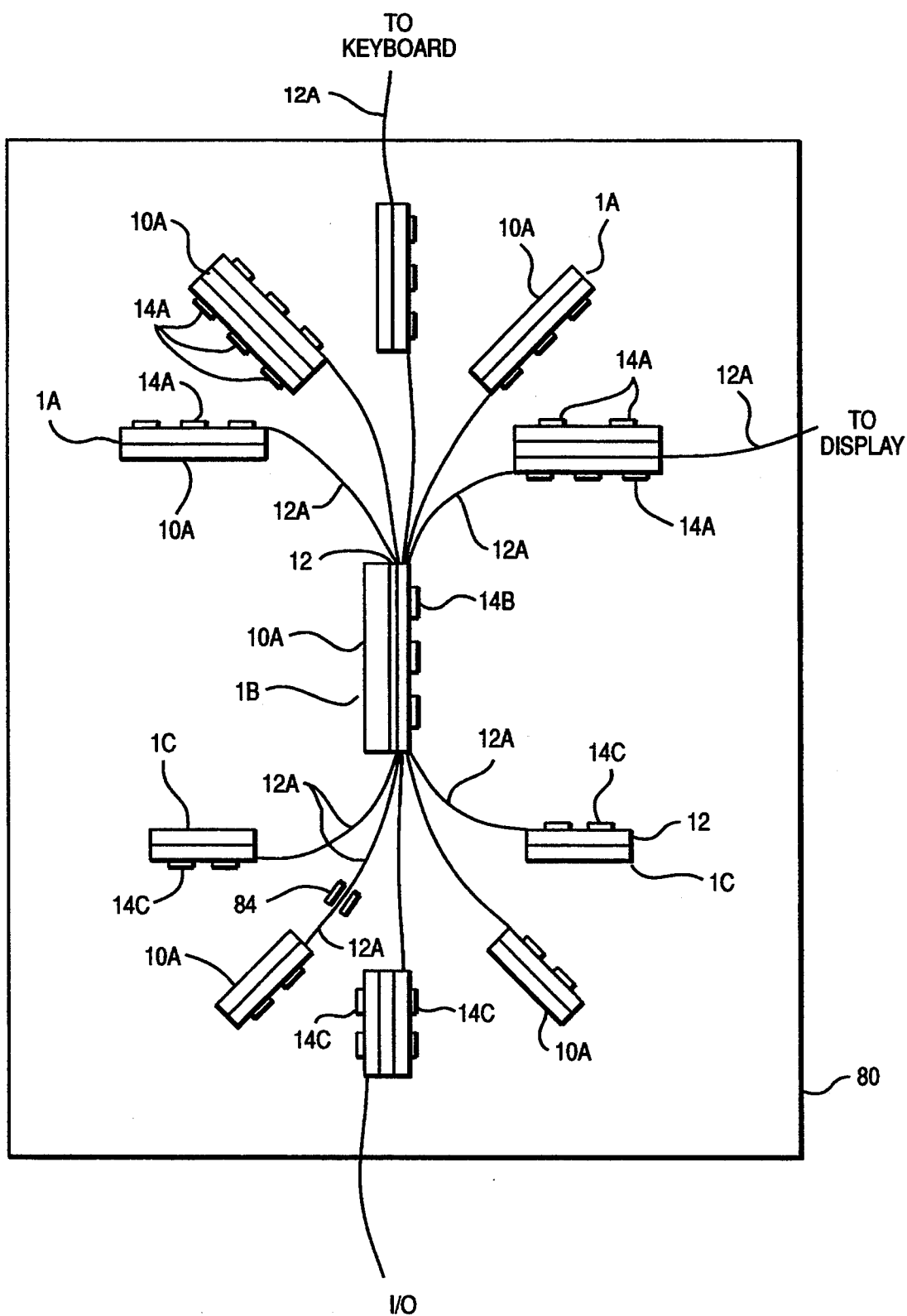
FIG. 9 shows a configuration for a computer system using the computational elements of the present invention.

Referring to FIG. 9, another embodiment of a configuration using a plurality of computational elements as the packaging architecture of a computer system is shown. Again, base 80 is shown having a plurality of computational elements 1 inserted into slots 82 formed therein. Again, power plane stiffener 10a is attached to a plurality of substrate layers 12, having extended portions 12a to interconnect the computational element 1 with other computational elements 1 located on base 80. Also, the configuration of computational element 1 is identical to those shown in detail in FIG. 2 and each can be manufactured using an identical process and identical materials. Reference numeral 84 represents a connector wherein extended portions 12a are connectable with one another such that projections 19 on element 12a will be correspondingly mate with cavities 23 in an adjacent extended substrate 12a, extending from another computational element 1 (FIG. 2). Further, with the configuration shown in FIG. 9, an entire computer system can be fabricated from similarly configured and interconnected computation elements 1, inserted into slots 82 on a base portion 80, thereby eliminating the need for a planar. More specifically, chips 14a may be a plurality of processors chips located on corresponding computational elements 1a and interconnected to a switching computational element 1b through extended substrate 12a. Chips 14c may be memory storage devices located on corresponding computational elements 1c and also interconnected to switching computational element 1b through extended portions 12a. Chips 14b can be switching control chips, e.g. a clock and logic gate arrays or the like, such that processor chips 14a are capable of communicating with and storing and retrieving data from memory chips 14c through extended portions 12a and switching computational element 1b. Additionally, substrates 12a can be extended from the computational elements (e.g. 1a), to peripheral devices such as a keyboard, a display, I/O port, or the like to provide a user interface with the computer system shown in FIG. 9. Of course, other peripheral devices such as a disk drive, mouse, trackball, or the like can be similarly interconnected to the system of FIG. 9.

Figure 10:
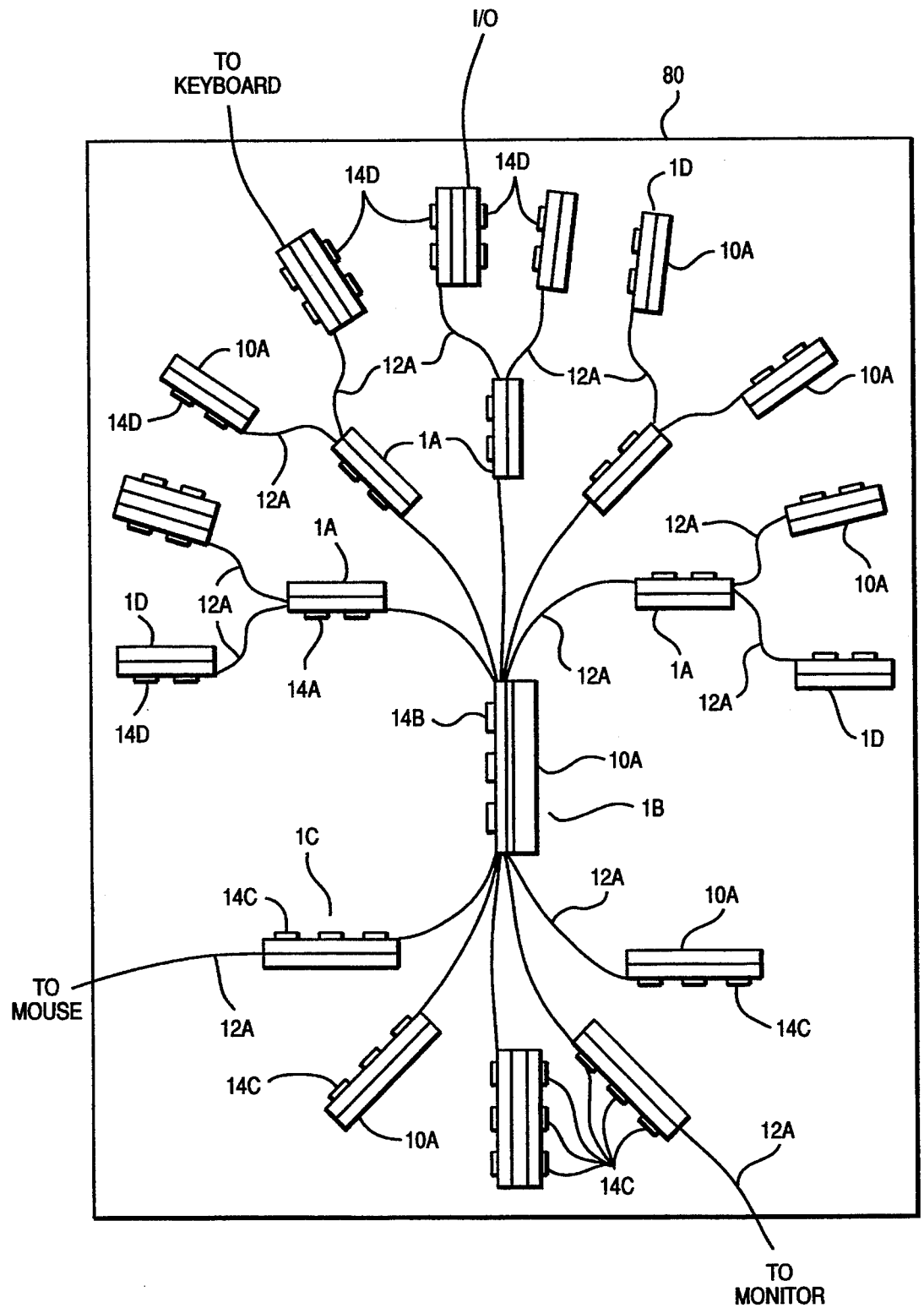
FIG. 10 is another, more complex interconnection scheme using the computational elements of the present invention.

FIG. 10 extends the computer packaging architecture of FIG. 9 by adding additional computational elements 1d which are formed by extending plural substrate layers 12a from computations elements 1a. Chips 14d, which may be additional memory or other computer functions disposed on computational elements 1d, are also interconnected to switching element 1b through computational elements 1a and associated extended substrates 12a. In this manner, every computational elements (1a, 1b, 1c, 1d) shown in FIG. 10 can communicate with every other computational element disposed on base portion 80. It can be seen how a virtually unlimited amount of computer function can be packaged and placed on base 80 in order to decrease the size required for the computer (no planar and small footprint) and increase processing speed due to the close proximity of the computational elements (and chips thereon) with one another. It can be seen that computational elements 1a are all equal distance from computational elements 1c (see also FIG. 9) thereby enhancing performances, since clock skew is minimized for synchronous communication between integrated circuit devices 14a and 14c.

Figure 11:
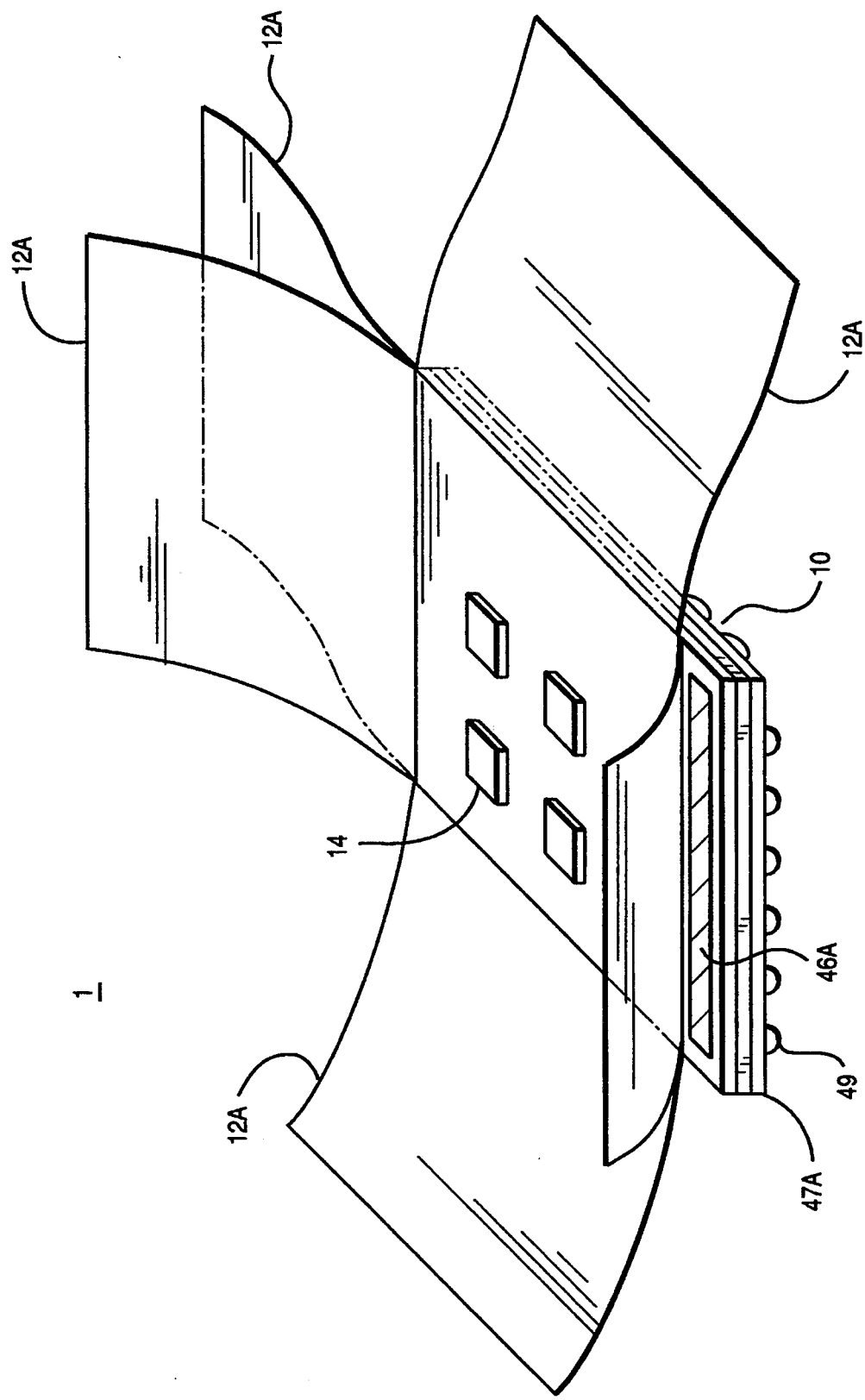
FIG. 11 is a configuration of a single computational element for a low end computer system wherein extended substrates that may be connected to I/O devices are shown extending from all four sides of the computational element.

FIG. 11 is an embodiment of a computational element 1 wherein substrates 12a extend from the element in four directions. Power plane 10 is shown having power connection means 49 on a side thereof opposite from substrates 12. Means 49 may be the pins or posts 34, 36 shown in FIG. 3, solder ball connect (SBC) I/Os, or the like. Thus, computational element 1 can be placed horizontally onto a substrate planar (if used) in a computer, or directly onto a connector within the base 80. In one preferred embodiment, a computer utilizing computational element 1 of FIG. 11 is a low end laptop or palmtop computer which has a single horizontally disposed computational element 1 and plural chips thereon, having different functions, to provide the functions required for the computer system. Substrates 12a extend from computational element 1 and can be attached to peripheral devices such as keyboard, monitor, mouse, modem or the like. Two separate power distribution interconnection configurations are shown in the embodiment of FIG. 11. I/O means 49 extend below power distribution element 10 on a side opposite of substrate 12. In this manner voltage and ground potential can be provided to chips 14 from a printed circuit board (PCB), or the like, in a computer system. As noted above, power connection means 49 may plug directly into a connector ill the computer base. Another alternative is to fabricate bus 46a on one side of power element 10, in a manner previously described with regard to FIG. 7 and to place another bus 47a on the side opposite bus 46a to provide a vertical interconnection scheme for the computational element 1 of FIG. 11.

Figure 13:
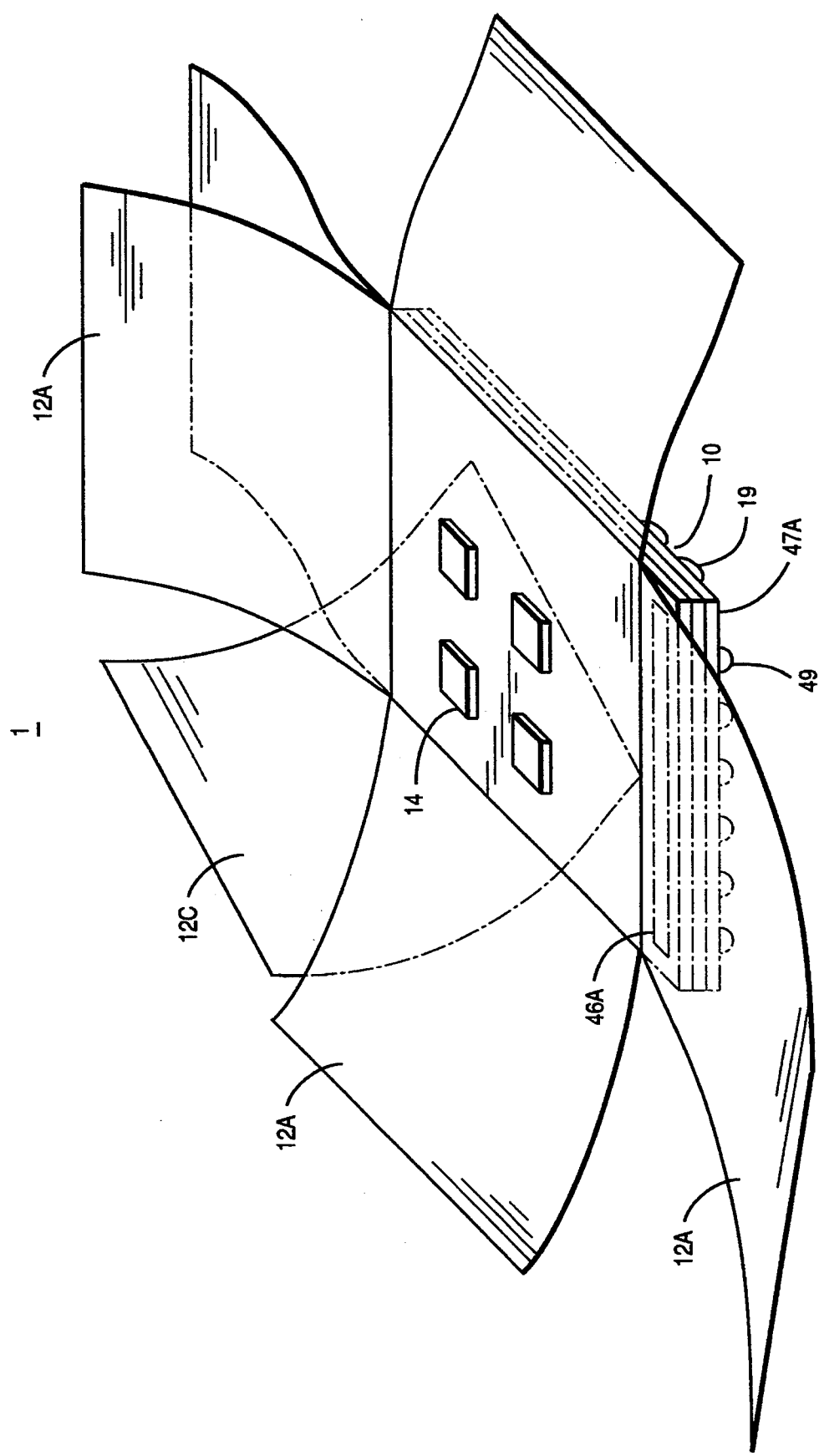
FIG. 13 is a further embodiment of a single computational element illustrating how substrates can extend from the computational element at various angles.

FIG. 13 shows yet another embodiment of a computational element 1, similar to that shown in FIG. 11, and includes an additional extended substrate 12c which is oriented to extend from computation element 1 angularly between extended substrates 12a. In this manner it can be seen how plural angularly disposed extended substrates 12c can be placed within the computational element 1 such that 360 degree placement of extended substrates around computational element 1 is possible by using the present invention. Those skilled in the art will understand that appropriate photoimageable material and artwork (photomask) can be used to fabricate substrate layers 12, 12a and angular layer 12c such that the angular placement of the substrates within computational element 1, as shown in FIG. 13, is possible.

Figure 14:
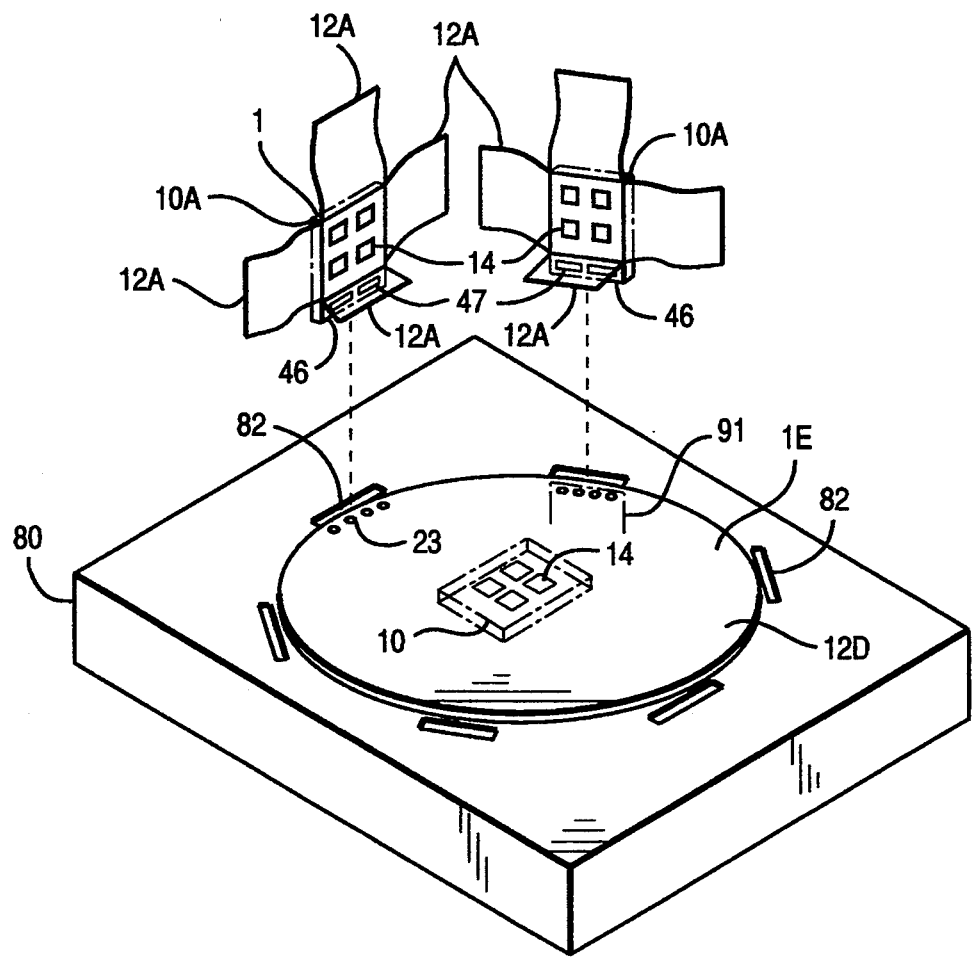
FIG. 14 is yet another embodiment of the present invention wherein a circular substrate extends from the computational element such that connection to other computational elements can be effected along the circumference of the circular substrate.

FIG. 14 is yet another embodiment of a computer packaging configuration for computational elements 1, contemplated by the present invention, to form a computer system. Again, base 80 is shown having interconnection slots 82 at appropriate locations. Power distribution element 10 is shown horizontally interconnected to a power connector that provides voltage and ground potential (not shown) in a manner similar to the embodiment of FIG. 6. A circularly configured extended substrate 12d is shown disposed above and in contact with power distribution element 10 in a manner as shown in FIG. 2, thereby forming a horizontally placed, substantially circular computational element 1e. It should be noted that extended circular substrate 12d can be fabricated in a manner similar to extended substrates 12a. For example, a large square or rectangular portion of the substrate 12 of FIG. 2 can be fabricated and a template used such that a circular portion can be cut from the rectangular substrate. Circuitized lines can then be formed on the surface of circular extended substrate 12d by conventional means such as plating, or the like. In this manner, cavities 23 can be formed in circular substrate 12d adjacent slots 82. A computational element having power distribution elements configured such as element 10a of FIGS. 7 and 8 can then be inserted into slots 82. Extended portions 12a will be used to interconnect adjacent computational elements 1 disposed along the periphery of extended circular substrate 12d. Substrate 12a extending downwardly from computational elements 1 can be fabricated to include projections 19 on an underside thereof. Downwardly extending substrate 12a can then be formed such that projections 19 (not shown) thereon can be inserted into cavities 23 of circular extended substrate 12a. A connector 91, such as the previously described connector 84 of FIG. 9, or any type of compression connector (for example a connector extending into base 80 with threaded adjustment such that the connector can be tightened to pull substrate 12a onto circular substrate 12d) can then be placed parallel to circular substrate 12d and on the top side of the downwardly extended substrate 12a. The connector can then be used to compress projections 19 into cavities 23 thereby making electrical contractions between. Additionally, joining metallurgy such as solder, or the like can be reflowed to make the electrical connection between extended substrate 12a and circular substrate 12d. In this manner, chips 14 of computational element 1e, including extended circular substrate 12d, are in communication with chips 14 of vertically inserted computation elements 1 disposed around the periphery of circular substrate 12d.

Thus, from the previous examples, it can be seen how a virtually unlimited number of differently configured computer systems can be fabricated using the basic component of the computational element, as contemplated by the present invention. The use of these computational elements will provide for smaller, more compact computer systems having higher processing speed which are capable of processing greater amounts of data than concurrently possible using conventional packaging techniques.

Although certain preferred embodiments have been shown and described it will be understood that many changes and modifications can be made therein without departing from the scope of the appended claims.

We claim:

1. A computational element that performs specific functions in a computer system, comprising:
   a plurality of flexibly independent substrate layers formed in a stacked relation and in electrical communication with one another, at least one of said substrate layers independently connectable to another device;
   at least one integrated circuit device disposed on an exterior substrate layer and in electrical communication with at least one of the other substrate layers; and
   means for supporting said plurality of substrate layers, and for distributing electrical power thereto from a power source connectable independently of said substrate layers.

2. An apparatus according to claim 1 wherein said means for supporting is disposed On a side of said plurality of substrate layers, opposite said at least one integrated circuit device, and in electrical communication with said integrated circuit device.

3. An apparatus according to claim 2 wherein said means for supporting comprises:
   alternate layers of electrically conductive material and high dielectric material;
   first interconnection means for electrically connecting said supporting means to said plurality of substrate layers; and
   second interconnection means for independently electrically connecting said supporting means with said base portion.

4. An apparatus according to claim 2 wherein said means for supporting is disposed intermediate said plurality of substrate layers and a plurality of integrated circuit devices disposed on said plurality of substrate layers.

5. An apparatus according to claim 4 wherein at least one of said plurality of substrate layers extend outwardly from said computational element and form an angle of from 0 to 360 degrees with the centerline of said computational element.

6. An apparatus according to claim 5 further comprising means for attaching said computational element to a base portion of said computer system, and for distributing electrical power thereto.

7. An apparatus according to claim 6 further comprising:
   a plurality of said computational elements disposed on said base portion, each electrically connected with one another by at least one of said extended substrate layers; and
   at least one input/output means interconnected to said plurality of computational elements by at least one of said extended substrate layers.

8. An apparatus according to claim 7 further comprising:
   a first said computational element having a circularly configured substrate layer extending therefrom, said first computational element being horizontally disposed on said base portion;
   at least one other of said computational elements vertically disposed along the periphery of said circular substrate layer; and
   means for electrically connecting one of said plurality of substrate layers from said at least one vertically disposed computational element with said circular substrate, such that said horizontal and vertical computational elements, and corresponding integrated circuit devices, are in electrical communication with one another.

9. An apparatus according to claim 8 wherein said first interconnection means comprises a plurality of conductive projections and cavities corresponding to respective conductive projections and cavities on an adjacent one of said plurality of substrate layers.

10. An apparatus according to claim 9 wherein said second interconnecting means comprises:
    a first electrical bus for supplying a voltage to said computational element; and
    a second electrical bus for providing a reference potential to said computational element.

11. An apparatus according to claim 10 wherein said means for supporting further comprises third interconnection means for electrically connecting said first interconnecting means with said second interconnecting means.

12. An apparatus according to claim 8 wherein said computational elements are configured with specific integrated circuit devices to provide processing, memory and switching functions.

13. A method of fabricating a computer systems using at least one computational element that performs specific functions therein, said method comprising the steps of:
    stacking a plurality of flexibly independent substrate layers;
    electrically connecting said substrate layers with one another;

independently connecting at least one of said substrate layers from said computational element with another device;

disposing at least one integrated circuit device on an exterior one of said substrate layers in electrical communication with at least one of said substrate layers; and providing means, within said computational element, for supporting said plurality of substrates, and for distributing electrical power thereto from an independently connectable power source.

14. A method according to claim 13 wherein said step of providing comprises the step of disposing said support means on a side of said plurality of substrate layers, opposite said at least one integrated circuit device in electrical communication with said integrated circuit device.

15. A method according to claim 14 wherein said step of disposing comprises the step of placing said means for supporting intermediate said plurality of substrate layers and a plurality of integrated circuit devices disposed on said plurality of substrate layers.

16. A method according to claim 15 wherein said step of independently connecting comprises the step of forming at least one of said plurality of substrates to extend outwardly from said computational element at an angle of from 0 to 360 degrees with the centerline of said computational element.

17. A method according to claim 16 further comprising the steps of:

attaching said computational element to a base portion of said computer system; and distributing electrical power to said computational element.

18. A method according to claim 17 further comprising the steps of:

disposing a plurality of said computational elements on said base portion, each being electrically connected with one another by said at least one extended substrate; and connecting at least one input/output means to said plurality of computational elements by at least one of said extended substrate layers.

19. A method according to claim 18 further comprising the steps of:

configuring a first said computational element substantially with a circularly configured substrate layer extending therefrom;

disposing said first computational element horizontally on said base portion;

vertically disposing at least one other of said computational elements along the periphery of said circular substrate; and electrically connecting one of said plurality of extended substrate layers from said at least one vertically disposed computational element with said circular substrate, such that said horizontal and vertical computational elements, and corresponding integrated circuit devices, are in electrical communication with one another.

20. A method according to claim 19 wherein said step of providing further comprises the steps of:

joining alternate layers of electrically conductive material and high dielectric material;

providing first interconnection means for electrically connecting said supporting means to said plurality of substrate layers; and providing second interconnection means for electrically connecting said supporting means with said base portion.

21. A method according to claim 20 further comprising the step of dissipating heat from said integrated circuit device through said alternate layers of conductive material.

* * * * *